United States Patent
Imaizumi (10) Patent No.: US 10,573,936 B2
(45) Date of Patent: *Feb. 25, 2020

(54) REMAINING BATTERY LIFE PREDICTION DEVICE AND BATTERY PACK

(71) Applicant: ABLIC INC., Chiba-shi, Chiba (JP)

(72) Inventor: Eiki Imaizumi, Chiba (JP)

(73) Assignee: ABLIC INC. (JP)

(*) Notice: Subject to any disclaimer, the term of this patent is extended or adjusted under 35 U.S.C. 154(b) by 455 days.

This patent is subject to a terminal disclaimer.

(21) Appl. No.: 14/943,417

(22) Filed: Nov. 17, 2015

(65) Prior Publication Data

US 2016/0149272 A1    May 26, 2016

(30) Foreign Application Priority Data

Nov. 20, 2014  (JP) ................. 2014-235738

(51) Int. Cl.
  *H01M 10/48*   (2006.01)
  *G01R 31/36*   (2019.01)
  (Continued)

(52) U.S. Cl.
  CPC .......... *H01M 10/48* (2013.01); *G01R 31/389* (2019.01); *G01R 31/3835* (2019.01); *G01R 31/392* (2019.01)

(58) Field of Classification Search
  CPC . H01M 10/48; G01R 31/362; G01R 31/3679; G01R 31/3662
  See application file for complete search history.

(56) References Cited

U.S. PATENT DOCUMENTS 6,789,026 B2   9/2004  Barsoukov et al.
9,201,121 B2   12/2015 Barsukov et al.
(Continued)

FOREIGN PATENT DOCUMENTS

JP   2013-153596   8/2013
JP   2014-505863   3/2014

OTHER PUBLICATIONS

Maxim, "DS2784: 1-Cell Stand-Alone Fuel Gauge IC with Li+ Protector and SHA-1 Authentication, Maxim Integrated Products," 19-4636; Rev. Mar. 2012 (Mar. 2012), Sunnyvale California, 2012, pp. 1-43.

(Continued)

*Primary Examiner* — Patrick Assouad
*Assistant Examiner* — Haidong Zhang
(74) *Attorney, Agent, or Firm* — Brinks Gilson & Lione (57) ABSTRACT

Provided is a low-cost battery pack capable of predicting a remaining battery life of a rechargeable battery with high accuracy. A remaining battery life prediction device includes: a voltage detection unit configured to measure a battery voltage and a battery temperature of the battery; a calculation unit configured to perform predictive calculation of a remaining battery life based on the battery voltage and the battery temperature; and a control unit configured to control operation of the remaining battery life prediction device and the calculation unit, the remaining battery life prediction device being configured to predict a remaining life of the battery with a calculation flow of for a predetermined time period, recursively calculating the remaining battery life based on the measured battery voltage and battery temperature and an internal impedance of the battery in a battery equivalent circuit.

6 Claims, 5 Drawing Sheets

(51) Int. Cl.
*G01R 31/3835* (2019.01)
*G01R 31/392* (2019.01)
*G01R 31/389* (2019.01)

(56) References Cited

U.S. PATENT DOCUMENTS

| | | | |
|---|---|---|---|
| 2010/0045240 A1* | 2/2010 | Bergveld | G01R 31/362 |
| | | | 320/132 |
| 2012/0323512 A1* | 12/2012 | Rhodin | G01R 31/3624 |
| | | | 702/63 |
| 2013/0187610 A1 | 7/2013 | Hayashi et al. | |
| 2014/0079969 A1* | 3/2014 | Greening | H01M 10/48 |
| | | | 429/91 |
| 2014/0244225 A1* | 8/2014 | Balasingam | G06F 17/5036 |
| | | | 703/2 |
| 2015/0127280 A1* | 5/2015 | Baba | H01M 10/48 |
| | | | 702/63 |

OTHER PUBLICATIONS

Office Action in Japanese Application No. 2014-235738 dated Sep. 27, 2018, including English Translation, pp. 1-5.

\* cited by examiner

REMAINING BATTERY LIFE PREDICTION DEVICE AND BATTERY PACK

RELATED APPLICATIONS

This application claims priority under 35 U.S.C. § 119 to Japanese Patent Application No. 2014-235738 filed on Nov. 20, 2014, the entire contents of which is hereby incorporated by reference.

BACKGROUND OF THE INVENTION

1. Field of the Invention

The present invention relates to a battery pack, and more particularly, to a remaining battery life prediction device configured to predict a remaining battery life of, for example, a lithium-ion rechargeable battery.

2. Description of the Related Art

It is required for rechargeable batteries that have been used in various devices represented by mobile devices to be provided with a battery management system configured to manage charging and discharging of the battery. An operating time of a device needs to be grasped more accurately particularly when the device is being operated, and a remaining battery life prediction device has been used for accurate detection.

Figure 6:
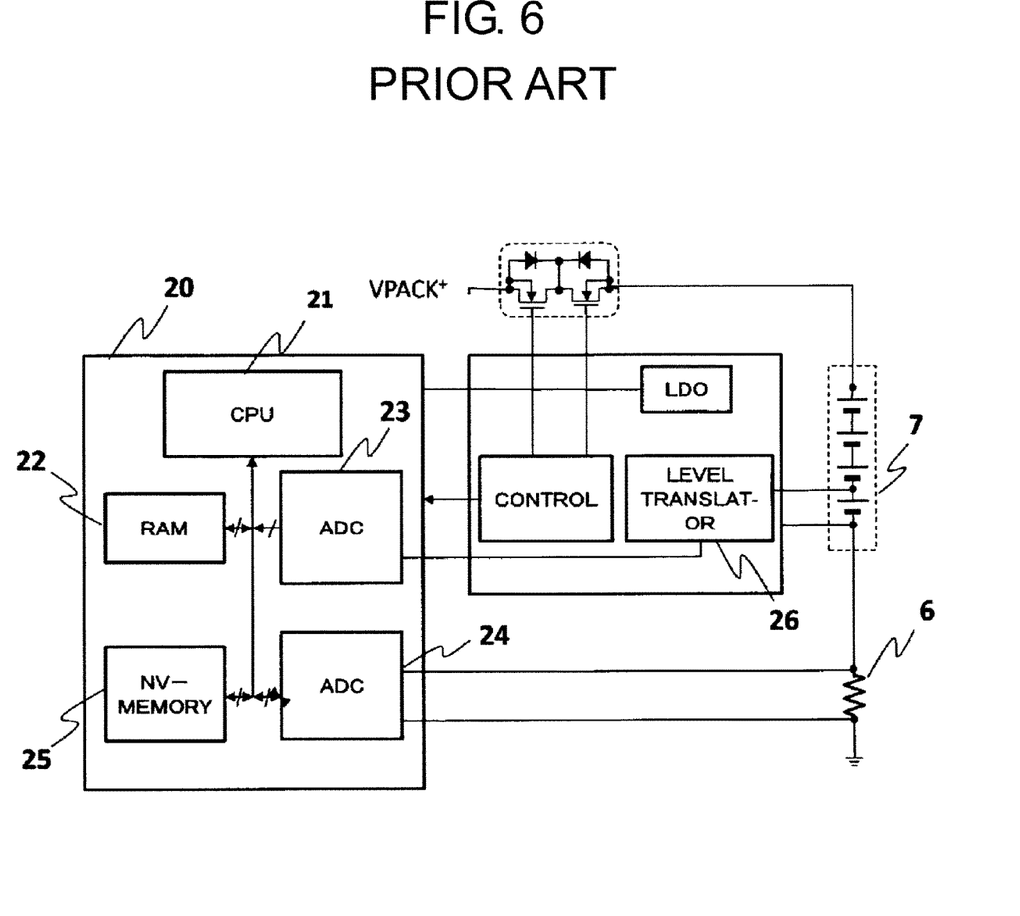
FIG. 6 is a block diagram of a battery pack including a related-art remaining battery life prediction device.

A battery pack including a related-art remaining battery life prediction device is illustrated in FIG. 6. A remaining battery life prediction device 20 includes a CPU 21 configured to perform signal processing calculation, a RAM 22 to be used in the signal processing calculation, an ADC 23 configured to detect a battery voltage obtained by converting, with a level translator 26, a battery voltage of a rechargeable battery 7 per one cell, an ADC 24 configured to detect a voltage generated at a current sensing resistor 6 for detecting a current of the rechargeable battery 7, and a non-volatile memory 25 configured to hold data on, for example, characteristics of a battery in advance. The remaining battery life prediction device 20 obtains a remaining battery life based on a voltage of the rechargeable battery 7, a transferred charge amount obtained through coulomb counting with a current value of the rechargeable battery 7 measured with the use of the current sensing resistor 6, and the like. In order to predict a remaining life with high accuracy, it is required to measure the voltage and current of the rechargeable battery 7 with high accuracy.

When attention is paid particularly to the current measurement, the current sensing resistor 6 is required to have a resistance value with high accuracy.

In order to predict a remaining battery life with high accuracy with the battery pack including the related-art remaining battery life prediction device 20, the highly accurate current sensing resistor 6 having a large permissible current amount is required. Thus, there is a problem in that the current sensing resistor 6 is expensive and large in size.

SUMMARY OF THE INVENTION

In order to solve the above-mentioned problem, a remaining battery life prediction device according to one embodiment of the present invention has the following configuration. The remaining battery life prediction device includes: a voltage detection unit configured to measure a battery voltage and a battery temperature of a battery; a calculation unit configured to perform predictive calculation of a remaining battery life based on the battery voltage and the battery temperature; and a control unit configured to control operation of the remaining battery life prediction device and the calculation unit. The remaining battery life prediction device is configured to predict a remaining life of the battery with a calculation flow of, for a predetermined time period, recursively calculating the remaining battery life based on the measured battery voltage and battery temperature and an internal impedance of the battery in a battery equivalent circuit.

According to the remaining battery life prediction device of the one embodiment of the present invention, the remaining battery life may be predicted with high accuracy based on the detected battery voltage, and hence no current sensing resistor is required. Consequently, a small and low-cost battery pack may be provided.

DETAILED DESCRIPTION OF THE PREFERRED EMBODIMENTS

Figure 1:
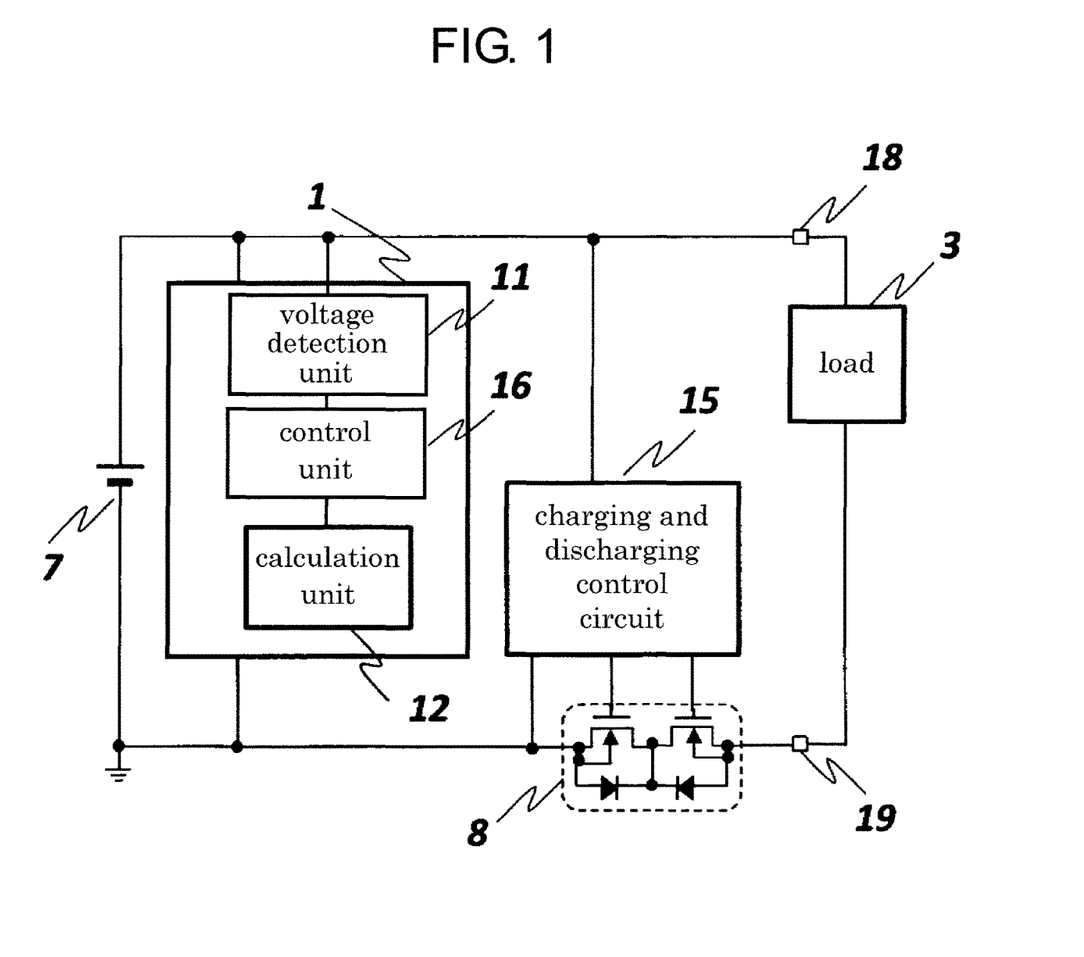
FIG. 1 is a block diagram of a battery pack including a remaining battery life prediction device according to an embodiment of the present invention.

FIG. 1 is a block diagram of a battery pack including a remaining battery life prediction device 1 according to an embodiment of the present invention. A battery pack of this embodiment includes the remaining battery life prediction device 1, a rechargeable battery 7, a MOSFET 8 for charging and discharging control, a charging and discharging control circuit 15, and external terminals 18 and 19. The remaining battery life prediction device 1 includes a voltage detection unit 11, a control unit 16, and a calculation unit 12 configured to perform predictive calculation of a battery remaining life and the like.

The battery pack of this embodiment has the following connections.

The remaining battery life prediction device 1 is connected to both ends of the rechargeable battery 7. The MOSFET 8 is connected to the external terminal 19. The charging and discharging control circuit 15 is connected to both the ends of the rechargeable battery 7, and has an output terminal connected to the MOSFET 8. An application system serving as a load 3 is connected to the external terminals 18 and 19. The voltage detection unit 11 has an input terminal connected to the rechargeable battery 7 and an output terminal connected to the control unit 16. The control unit 16 is connected to the calculation unit 12.

The voltage detection unit 11 detects a terminal voltage and a temperature of the rechargeable battery 7, and outputs the detected values to the control unit 16. The control unit 16 includes, for example, a timer circuit and a storage device such as a RAM or a non-volatile memory. The calculation unit 12 performs predictive calculation of a remaining battery life of the rechargeable battery 7 with high accuracy based on information and control of the control unit 16. That is, the remaining battery life prediction device 1 performs predictive calculation of a remaining battery life of the rechargeable battery 7 with high accuracy by executing a remaining battery life predictive calculation flow illustrated in FIG. 4 or FIG. 5.

Figure 2:
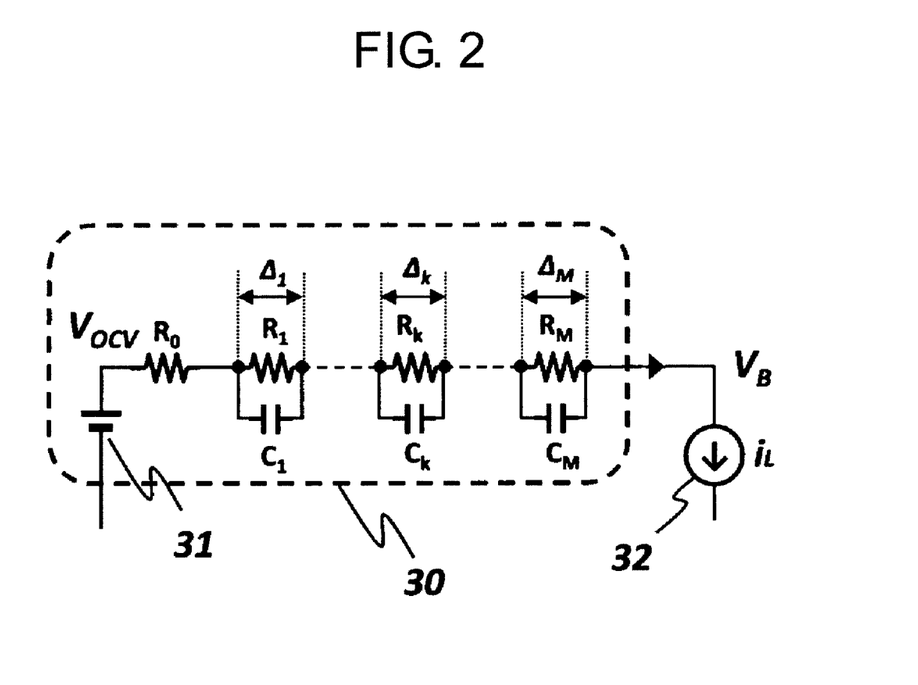
FIG. 2 is a circuit diagram for illustrating an example of an equivalent circuit of a battery.

FIG. 2 is a circuit diagram for illustrating an example of an equivalent circuit of a battery. A battery equivalent circuit 30 includes a voltage source 31, M C-R circuit pairs connected in series, and a resistor Ro. The voltage source 31 outputs a battery open circuit voltage depending on a charge state and a battery temperature. The C-R circuit includes a resistor R and a capacitor C connected in parallel to each other that form an equivalent circuit of an internal impedance of the battery. A voltage $V_{OCV}$ corresponds to a voltage of the voltage source 31. A voltage $V_B$ corresponds to a voltage of the battery. A current source 32 corresponds to an equivalent circuit of the load 3 through which a load current $i_L$ flows.

The C-R circuits reflect a transient response of an output of the battery. The number of the C-R circuits connected in series depends on desired accuracy of the equivalent circuit, and the accuracy is improved more easily as the number of the circuits connected in series is increased. When time constants of the C-R circuits are sufficiently smaller than a time period of remaining life calculation, the remaining life calculation is less affected by the transient response of the output of the battery. However, time constants of the transient response of output of the battery sometimes extend from several tens of minutes to several hours, and greatly affect the predictive calculation of a battery remaining life. In particular, when a large current changes rapidly, such time constants tend to lead to a large error in predictive calculation of a battery remaining life.

In order to reflect the influence of the battery transient response to the predictive calculation of a battery remaining life, it is required that the predictive calculation of a battery remaining life be performed based on a temporal differential equation including a resistor $R_k$ and a capacitor $C_k$ that form the internal impedance of the battery.

Differential equations are now given. A voltage applied to the resistor $R_k$ and the capacitor $C_k$ is represented by $\Delta_k$ (k≥1). Then, a current $i_{Rk}$ flowing through each of resistors $R_1$ to $R_M$ is expressed by Expression 1, a current $i_{ck}$ flowing through each of capacitors $C_1$ to $C_M$ is expressed by Expression 2, and the load current $i_L$ is expressed by Expression 3. Two equations of Expression 4 and Expression 5 are thus obtained.

$$i_{R_k} = \Delta_k / R_k \tag{1}$$

$$i_{C_k} = \frac{\partial}{\partial t}(C_k \cdot \Delta_k) \tag{2}$$

$$i_L = i_{R_k} + i_{C_k} \tag{3}$$

$$i_L \cdot R_k = \Delta_k + R_k \cdot \frac{\partial}{\partial t}(C_k \cdot \Delta_k) \tag{4}$$

$$V_{ocv} - VB = i_L \cdot R_0 + \sum_{k=1}^{M} \Delta_k \tag{5}$$

The load current $i_L$ can be expressed by Expression 6 with the charge state of the battery, namely, a change in remaining battery life SOC, and a maximum battery capacity $Q_{max}$. Note that, a discharge current is a positive current.

$$i_L = -Q_{max} \cdot \frac{\partial SOC}{\partial t} \tag{6}$$

When Expression 6 is substituted into Expression 4 and Expression 5, Expression 7 and Expression 8 are obtained.

$$-Q_{max} \cdot \frac{\partial SOC}{\partial t} \cdot R_k = \Delta_k + R_k \cdot \frac{\partial}{\partial t}(C_k \cdot \Delta_k) \tag{7}$$

$$V_{ocv} - VB = -Q_{max} \cdot \frac{\partial SOC}{\partial t} \cdot R_0 + \sum_{k=1}^{M} \Delta_k \tag{8}$$

It is assumed in Expression 7 and Expression 8 that $V_{OCV}$, $R_k$ (k=0 to M), and $C_k$ (k=1 to M) have dependence on the remaining battery life SOC and the battery temperature T, and an actually measured battery voltage $V_B$, an initial value of the remaining battery life $SOC_i$, and an initial value of the battery internal voltage $\Delta_{k,i}$ are known. Then, the simultaneous equation is solved, thereby being capable of obtaining the remaining battery life SOC.

However, in order to solve this simultaneous equation as a differential equation, a calculation amount and a logic scale required for the realization are large, which means that this method is impractical. Accordingly, approximating this simultaneous equation to a difference equation is considered. When Expression 7 is transformed into a difference equation of a time point n and a time point n−1 prior to the time point n by a time $t_c$, Expression 7 can be expressed as Expression 9.

$$-Q_{max} \cdot \frac{(SOC_n - SOC_{n-1})}{t_C} \cdot R_{k,n} = \Delta_{k,n} + R_{k,n} \cdot C_{k,n} \cdot \frac{(\Delta_{k,n} - \Delta_{k,n-1})}{t_C} \tag{9}$$

Expression 9 is calculated about $\Delta_{k,n}$ to obtain Expression 10.

$$\Delta_{k,n} = \frac{-Q_{max} \cdot (SOC_n - SOC_{n-1}) \cdot R_{k,n}/t_C + C_{k,n} \cdot R_{k,n} \cdot \Delta_{k,n-1}/t_C}{1 + C_{k,n} \cdot R_{k,n}/t_C} \tag{10}$$

Then, Expression 10 is substituted into Expression 8 to obtain Expression 11.

$$V_{ocv,n} - VB_n + \frac{Q_{max} \cdot (SOC_n - SOC_{n-1})}{t_C} \cdot R_0 - \sum_{k=1}^{M} \frac{-Q_{max} \cdot (SOC_n - SOC_{n-1}) \cdot R_{k,n}/t_C + C_{k,n} \cdot R_{k,n} \cdot \Delta_{k,n-1}/t_C}{1 + C_{k,n} \cdot R_{k,n}/t_C} = 0 \tag{11}$$

Expression 11 is solved with a remaining battery life $SOC_n$ being an unknown variable, thereby being capable of obtaining a value of the remaining battery life $SOC_n$ at the time point n. For predictive calculation at a time point n+1 after the time $t_c$ has been elapsed from the time point n, $\Delta_{k,n}$ at the time point n is obtained from Expression 10. This calculation is subsequently repeated, thereby enabling real-time predictive calculation of a remaining battery life.

Figure 4:
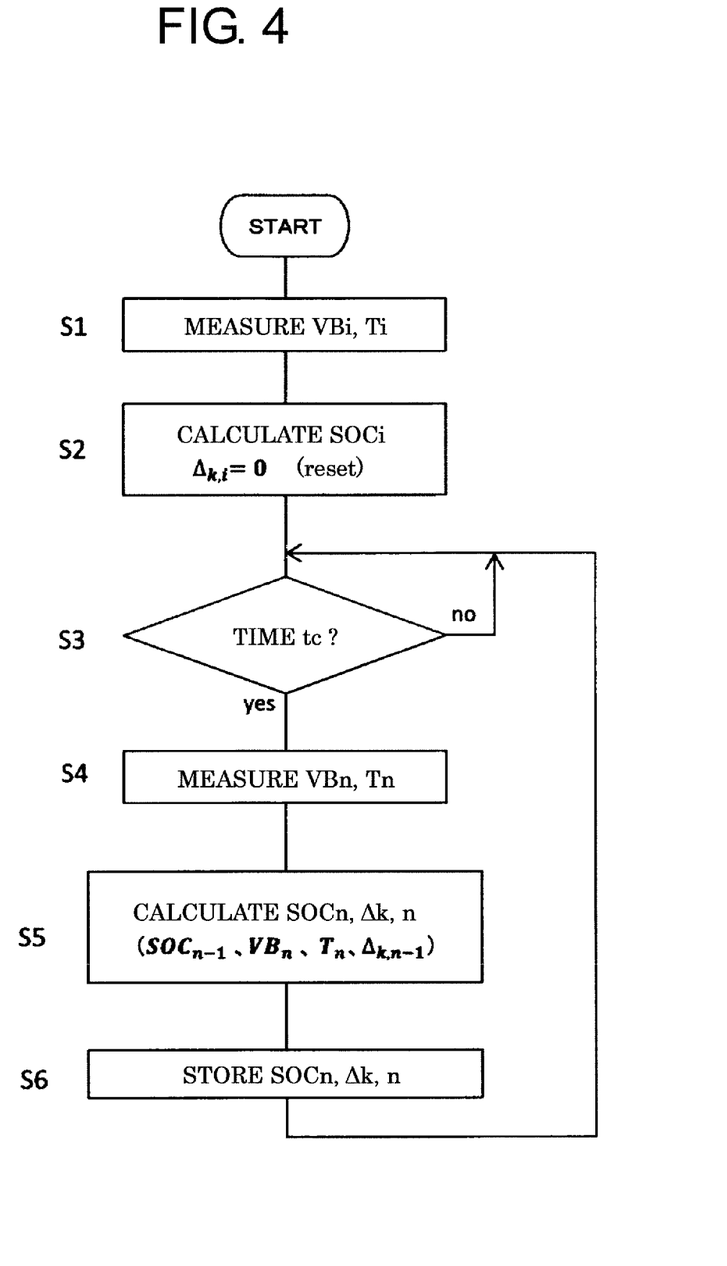
FIG. 4 is a remaining battery life predictive calculation flow corresponding to the equivalent circuit of the battery of FIG. 2.

FIG. 4 is the above-mentioned remaining battery life predictive calculation flow corresponding to the equivalent circuit of the battery of FIG. 2.

A remaining battery life of the battery pack of this embodiment is unknown, for example, when the battery is mounted. Accordingly, in Step S1, an initial battery terminal voltage $VB_i$ and an initial battery temperature $T_i$ are detected by the voltage detection unit 11. The battery terminal voltage $VB_i$ at this time point can be considered to be equal to the battery open circuit voltage $V_{OCV}$, when no current flows through the rechargeable battery 7. Moreover, the initial value $\Delta_k$, of the battery equivalent circuit internal voltage $\Delta_k$ is 0 when no current flows, as can be easily understood from FIG. 2.

The battery open circuit voltage $V_{OCV}$ of the rechargeable battery 7 has battery-specific dependence characteristics defined in advance based on the remaining battery life SOC and the battery temperature T. The characteristic is assumed by Expression 12.

$$OCV = f_{ocv}(SOC, T) \quad (12)$$

In Step S2, an initial remaining battery life $SOC_i$ is calculated based on the battery terminal voltage $VB_i$ and the battery temperature $T_i$ of the rechargeable battery 7. The measurement and the predictive calculation of a remaining battery life are subsequently repeatedly performed for the predetermined time period $t_c$ (Step S3).

In Step S4, the voltage detection unit 11 detects a battery terminal voltage $VB_n$ and a battery temperature at the time point n after the time $t_c$ has been elapsed.

In Step S5, a remaining battery life $SOC_n$, a battery open circuit voltage $V_{OCV,n}$, a battery current $i_{L,n}$, and a battery equivalent circuit internal voltage $\Delta_{k,n}$ at the time point n are calculated based on a remaining battery life $SOC_{n-1}$, a battery temperature $T_{n-1}$, and a battery equivalent circuit internal voltage $\Delta_{k,n-1}$ at the time point n−1, and the battery voltage $VB_n$ and the battery temperature $T_n$ detected at the time point n. Note that, the initial remaining battery life $SOC_i$ is used as the remaining battery life $SOC_{n-1}$ when performing the processing of Step S5 for the first time.

Characteristics that are required to be defined as the battery characteristics in advance include, in addition to the characteristic assumed by Expression 12, the resistor $R_k$ (k=0 to M), the capacitor $C_k$ (k=1 to M), and the maximum battery capacity $Q_{max}$. Those characteristics have battery-specific characteristics at the early stage of manufacture. As the internal impedance of the battery equivalent circuit, two expressions described below are assumed.

$$R_k = fr_k(SOC, T), k \geq 0 \quad (13)$$

$$C_k = fc_k(SOC, T), k \geq 1 \quad (14)$$

Those two expressions are applied to Expression 11 to obtain Expression 15.

$$f_{ocv}(SOC_n, T_n) - VB_n + \frac{Q_{max} \cdot (SOC_n - SOC_{n-1})}{t_C} \cdot fr_0(SOC_n, T_n) - \sum_{k=1}^{M} \frac{-Q_{max} \cdot (SOC_n - SOC_{n-1}) \cdot fr_k(SOC_n, T_n)/t_C + fc_k(SOC_n, T_n) \cdot fr_k(SOC_n, T_n) \cdot \Delta_{k,n-1}/t_C}{1 + fc_k(SOC_n, T_n) \cdot fr_k(SOC_n, T_n)/t_C} = 0 \quad (15)$$

A remaining battery life $SOC_n$ at the time n, which satisfies Expression 15, is calculated through recursive calculation. The battery open circuit voltage $V_{OCV,n}$, the battery current $i_{L,n}$, and the battery equivalent circuit internal voltage $\Delta_{k,n}$ can be respectively calculated based on the calculated remaining battery life $SOC_n$. In Step S6, those calculated numerical values are written into the storage device to be held thereby.

The calculation steps of Step S3 to Step S6 described above are repeatedly performed, thereby enabling real-time predictive calculation of a battery remaining life.

Note that, when a battery open circuit voltage $f_{OCV}$, (SOC, T), a battery internal resistance $R_k = f_{rk}$ (SOC, T), and a battery internal capacitor's capacitance $C_k = f_{ck}$ (SOC, T) cannot be simply expressed by algebraic functions, those values are defined as functions expressed in a numerical table. The variable values (SOC, T), which do not exist as values in the table, are calculated by interpolation or extrapolation.

As described above, according to the battery pack including the remaining battery life prediction device and the remaining battery life predictive calculation flow of this embodiment, without actually detecting a battery current, it is possible to perform predictive calculation of a remaining battery life with high accuracy while taking a transient response of an output of the battery into consideration. Thus, a highly accurate current sensing resistor needed for battery current detection is not required, which leads to reduction in cost and mounting size.

Figure 3:
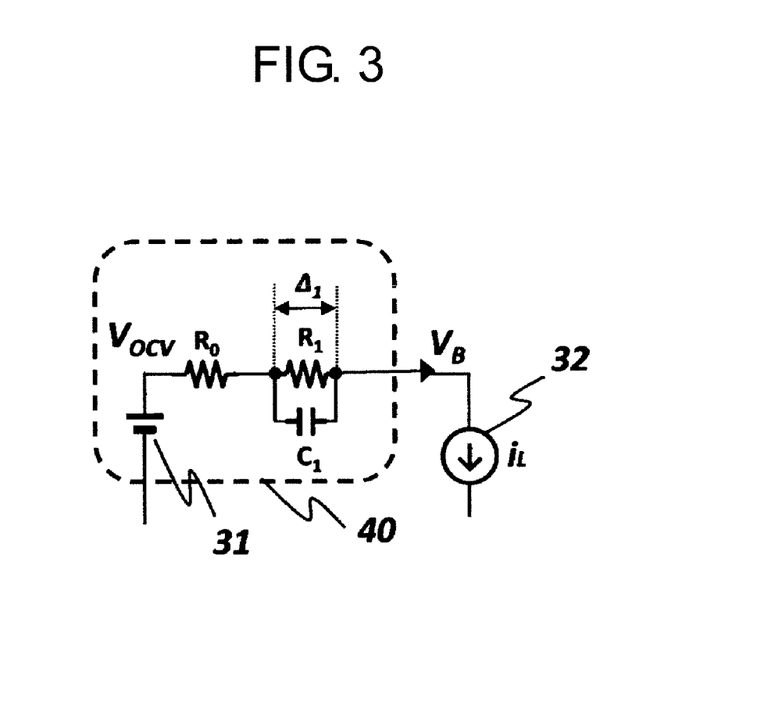
FIG. 3 is a circuit diagram for illustrating another example of the equivalent circuit of the battery.

FIG. 3 is a circuit diagram for illustrating another example of the equivalent circuit of the battery. In a battery equivalent circuit 40 illustrated in FIG. 3, an equivalent circuit of an internal impedance of the battery is simplified to include one C-R circuit pair. Even with the equivalent circuit of the battery simplified in this way, predictive calculation of a remaining battery life can be performed with a method described in detail below.

M is 1 in Expression 1 to Expression 3, and hence two equations of Expression 16 and Expression 17 are obtained.

$$i_L \cdot R_1 = \Delta_1 + R_1 \cdot \frac{\partial}{\partial t}(C_k \cdot \Delta_k) \quad (16)$$

$$V_{ocv} - VB = i_L \cdot R_0 + \Delta_1 \quad (17)$$

Then, Expression 18 can be obtained from Expression 16 and Expression 17.

$$V_{ocv} - VB - i_L \cdot (R_0 + R_1) + C_1 \cdot R_1 \cdot \frac{\partial}{\partial t}(V_{ocv} - V_B - i_L \cdot R_0) = 0 \quad (18)$$

The differential equation of Expression 18 is approximated to a difference equation, thereby obtaining Expression 19.

$$V_{ocv,n} - VB_n - i_{L,n} \cdot (R_{0,n} + R_{1,n}) + C_{1,n} \cdot R_{1,n} \cdot \frac{(V_{ocv,n} - VB_n - V_{ocv,n-1} + VB_{n-1})}{t_C} - C_{1,n} \cdot R_{1,n} \cdot R_{0,n} \cdot \frac{i_{L,n} - i_{L,n-1}}{t_C} - C_{1,n} \cdot R_{1,n} \cdot i_{L,n} \cdot \frac{R_{0,n} - R_{0,n-1}}{t_C} = 0 \quad (19)$$

Note that, the battery current $i_{L,n}$ can be expressed by Expression 20 as an approximate expression of a difference equation.

$$i_{L,n} = -Q_{max} \cdot \frac{(SOC_n - SOC_{n-1})}{t_C} \quad (20)$$

Expression 19 does not include the variable $\Delta_{k,n-1}$, and hence, without calculating the battery equivalent circuit internal voltage, the remaining battery life $SOC_n$ at the current time point n can be calculated from Expression 19 based on the battery open circuit voltage $V_{OCV,n-1}$, the battery voltage and the remaining battery lives $SOC_{n-1}$ and $SOC_{n-2}$. Note that, the initial remaining battery life $SOC_i$ is used as the remaining battery lives $SOC_{n-1}$ and $SOC_{n-2}$ when performing the processing of Step S5 for the first time.

Figure 5:
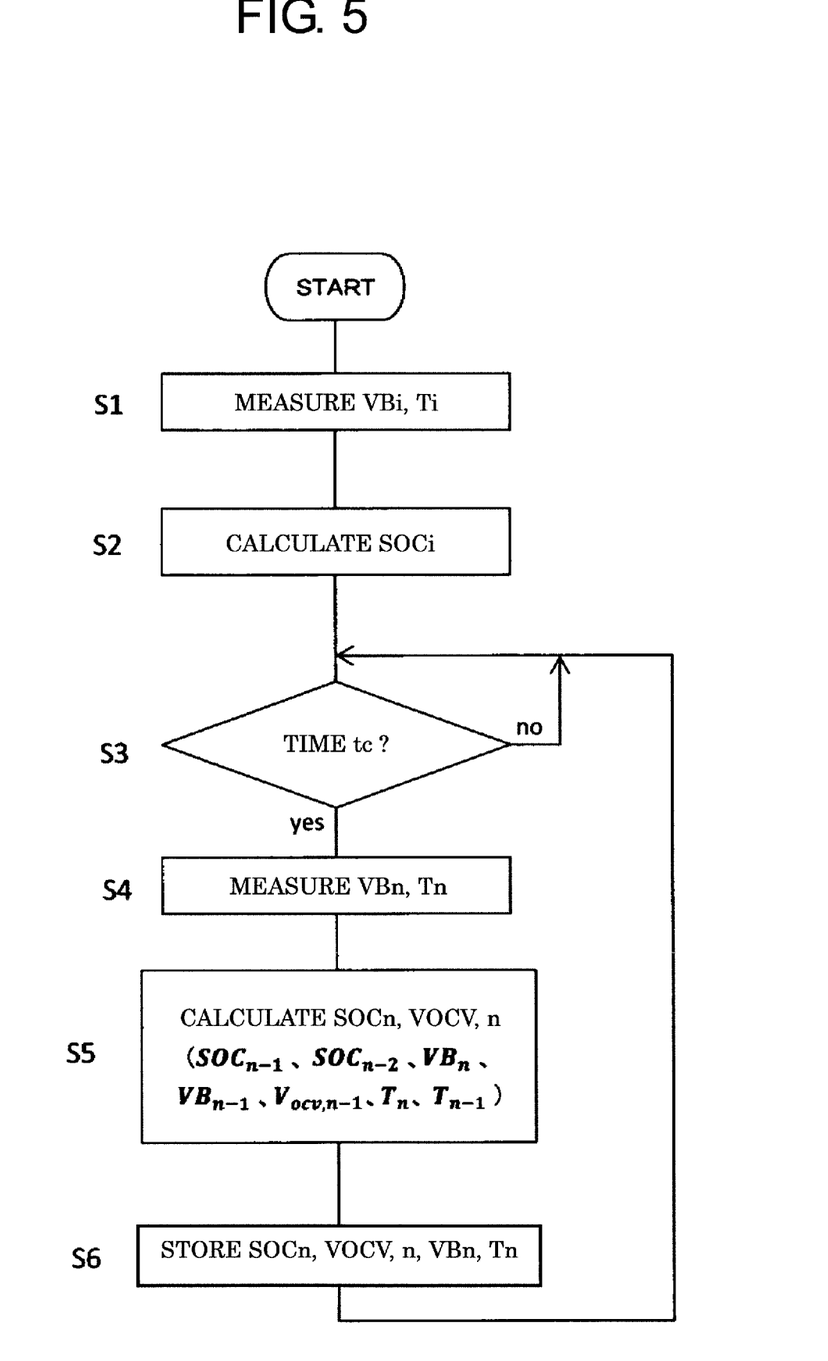
FIG. 5 is a remaining battery life predictive calculation flow corresponding to the equivalent circuit of the battery of FIG. 3.

FIG. 5 is a remaining battery life predictive calculation flow corresponding to the equivalent circuit of the battery of FIG. 3.

As described above, calculation using binary numbers is employed in the predictive calculation of a remaining battery life illustrated in FIG. 5. Thus, when a time period of the calculation is set to $2^N$ (N is an integer) seconds, a logic scale of the calculation is easily reduced, which contributes to reduction in chip size of an integrated circuit in which the remaining battery life prediction device is integrated.

What is claimed is:

1. A battery pack, comprising:
    a MOSFET configured to control a load current and a battery connected in series between a first external terminal and a second external terminal to which a load is connected;
    a control circuit that is connected to both ends of the battery and is configured to monitor a state of the battery and control the MOSFET; and
    a remaining battery life prediction device connected to both the ends of the battery and configured to predict a remaining life of the battery, the device comprising:
    a voltage detection unit configured to measure a battery voltage and a battery temperature of the battery;
    a calculation unit configured to perform predictive calculation of a remaining battery life based on the battery voltage and the battery temperature; and
    a control unit configured to control operation of the remaining battery life prediction device and the calculation unit,
    the remaining battery life prediction device being further configured to predict the remaining life of the battery with the calculation unit configured to perform a calculation flow of, for a predetermined time period, recursively calculating the remaining battery life at predetermined intervals based on a currently measured battery terminal voltage and battery temperature, an internal impedance of the battery in a battery equivalent circuit, a last measured battery terminal voltage and battery temperature, and a last calculated remaining battery life and battery open circuit voltage, such that the remaining battery life prediction device does not include a current sensing device connected to the battery.

2. The remaining battery life prediction device according to claim 1, wherein the battery equivalent circuit comprises:
    a voltage source configured to output a battery open circuit voltage;
    a first resistor connected to the voltage source in series; and
    an internal impedance element connected to the first resistor in series and includes a resistor and a capacitor connected in parallel to each other.

3. The remaining battery life prediction device according to claim 2, wherein the calculation unit is configured to perform the calculation flow that further comprises:
    measuring an initial battery terminal voltage and an initial battery temperature when the battery is mounted;
    calculating an initial remaining battery life based on the initial battery terminal voltage and the initial battery temperature;
    measuring the battery terminal voltage and the battery temperature for the predetermined time period; and
    holding, in a storage device, the currently measured battery terminal voltage and battery temperature and the currently calculated remaining battery life and battery open circuit voltage for the predetermined time period.

4. The remaining battery life prediction device according to claim 2, wherein the internal impedance in the battery equivalent circuit comprises a plurality of the impedance elements connected in series.

5. The remaining battery life prediction device according to claim 4, wherein the calculation unit is configured to perform the calculation flow that futher comprises comprises:
    measuring an initial battery terminal voltage and an initial battery temperature when the battery is mounted;
    calculating an initial remaining battery life based on the initial battery terminal voltage and the initial battery temperature;
    setting an initial value to a voltage applied to the impedance element; and
    holding, in a storage device, the currently calculated remaining battery life and voltage applied to the impedance element for the predetermined time period.

6. The remaining battery life prediction device according to claim 1, wherein the predetermined time period for which the predictive calculation of the remaining battery life is performed is $2^N$ seconds, where N is an integer.

* * * * *